United States Patent [19]
Kess

[11] Patent Number: 4,883,984
[45] Date of Patent: Nov. 28, 1989

[54] PIN DIODE SWITCH

[75] Inventor: Helmut Kess, Erlangen, Fed. Rep. of Germany

[73] Assignee: Siemens Aktiengesellschaft, Berlin and Munich, Fed. Rep. of Germany

[21] Appl. No.: 216,019

[22] Filed: Jul. 7, 1988

[30] Foreign Application Priority Data

Jul. 17, 1987 [DE] Fed. Rep. of Germany ....... 3723738

[51] Int. Cl.$^4$ .................. H03K 17/74; H03K 3/33; H01P 1/10; H03H 7/48
[52] U.S. Cl. ................................ 307/256; 307/257; 307/259; 307/317.1; 307/321; 333/262; 333/101; 333/103; 333/104
[58] Field of Search ............... 307/540, 256, 257, 259, 307/317.1, 321; 333/262, 101, 103, 104

[56] References Cited

U.S. PATENT DOCUMENTS

| | | | |
|---|---|---|---|
| 3,244,867 | 4/1966 | Lavin | 307/259 |
| 3,296,457 | 1/1967 | Robbins | 307/259 |
| 3,774,123 | 11/1973 | Hume | 333/104 |
| 4,267,538 | 5/1981 | Assal | 307/262 |
| 4,486,722 | 12/1984 | Landt | 333/17 M |
| 4,486,723 | 12/1984 | Lysobey | 333/262 |
| 4,621,244 | 11/1986 | Heiter | 307/540 |
| 4,673,831 | 6/1987 | Reppen | 307/317 R |

FOREIGN PATENT DOCUMENTS 0928648  5/1982  U.S.S.R. .............. 307/256

OTHER PUBLICATIONS

Waugh; "Broadbanding the Shunt Pin-Diode SPDT Switch", Feb. 1975, pp. 55,59–60.
New England Microwave Corp., "Pin -Diode Switching Used at Microwave Frequencies", MSN & CT Nov. 1986, pp. 107–109.
"Control Circuits Using Diode Switches", Kollar et al., Instrum. & Exp. Techn., vol. 20, no. 1/1 Jan./Feb. 1977, pp. 125–127.
"Pin-Diode Switches Excel in Wide-Bandwidth Use", Hartke, E.D.N. Electrical Design News, vol. 27, no. 18, Sep. 15, 1982, pp. 161–166.
"High Power RF Switching Diode Can Replace Mechanical Coax Relays", Clar., Motorola Semiconductor Technical Information, AN161, 6-65, pp. 1–5.

Primary Examiner—Stanley D. Miller
Assistant Examiner—Nancy Thai
Attorney, Agent, or Firm—Hill, Van Santen, Steadman & Simpson

[57] ABSTRACT

A PIN diode switch suitable for switching radio-frequency voltages has a series circuit of two oppositely polarized PIN diodes, with a control current supplied to the junction between the two PIN diodes through the collector-emitter path of a transistor and through an inductor. The necessity of using a high-voltage power pack to generate a high reverse bias in order to avoid limiting the amplitude of the radio frequency voltage to be switched is not necessary, as in conventional PIN diode switches.

3 Claims, 2 Drawing Sheets

PIN DIODE SWITCH

BACKGROUND OF THE INVENTION

1. Field of the Invention

The present invention is directed to a PIN diode switch suitable for switching radio-frequency voltages.

2. Description of the Prior Art

A PIN diode switch of the type capable of switching radio-frequency voltages is described in "PIN-Diode Switches Excel In Wide-Bandwidth Use," Hartke, E.D.N. (Electrical Design News), Vol. 27, No. 18, Sept. 1982, pages 161–166. One of the PIN diodes switches disclosed therein consists of a series circuit of oppositely polarized PIN diodes disposed between the input and the output of the switch, with a control current supplied through another PIN diode to the junction of the series-connected PIN diodes. The drive circuit described in this article is suitable only for low radio-frequency voltages. In order to use the circuit to switch higher radio-frequency voltages, a higher reverse bias for the diodes would be required.

The general use of PIN diodes for RF-switches is known, for example, from the text "Signalverarbeitende Dioden," Kesel et al, 1982, pages 54–56. The generalized circuit diagrams described therein are reproduced as FIGS. 1 and 2 herein, and will be used to explain the general operation of such switches, as well as problems associated with conventional switches of this type.

As shown in FIG. 1, a PIN diode 1 is disposed between an input A and an output B of a switch. A control current $I_{v1}$, or a control voltage $U_{v1}$, is applied to the PIN diode 1. The PIN diode 1 is in a conductive condition as long as it is not charged with a control voltage $U_{v1}$ in the non-conducting direction, as a reverse bias.

As shown in FIG. 2, PIN diodes can also be used in a switchover circuit, by using a further PIN diode 1' connecting the input A to a second output C. The PIN diodes 1 and 1', for example, can be alternatingly charged with blocking voltages.

In this known circuit design, the radio-frequency voltage to be switched is limited in amplitude by the available reverse bias $U_{v1}$. The reverse bias $U_{v1}$ cannot be permitted to be higher than the maximum permissible blocking voltage of the PIN diodes 1 or 1'. A high-voltage power pack is thus required for generating such high reverse biases, which is relatively complex to design.

SUMMARY OF THE INVENTION

It is an object of the present invention to provide a PIN diode switch wherein no reverse bias is required to operate the switch.

The above object is achieved in accordance with the principles of the present invention in a PIN diode switch having two oppositely polarized PIN diodes connected in series between the input and an output of the switch, with a control current for the diodes being supplied to the junction between the two diodes via the collector-emitter path of a transistor, and via an inductor.

The need for a reverse bias is eliminated due to the two, oppositely polarized PIN diodes, and due to the construction of the drive circuit. When the transistor through which the drive current is supplied is not conducting, they are the equivalent of low-capacitance capacitors which are charged only once via the PIN diodes. No reverse bias is thus required. For switching to the conductive condition, the PIN diode switch is supplied with a control current. The control current to be switched, given low voltage, can be achieved in a significantly simpler manner than a high-voltage to be switched, particularly when fast switching is required.

The current switch will still be transmitted due to the finite off-state resistance of the PIN diode switch can be dissipated to a reference potential (or can be reflected in an embodiment wherein the output of the PIN diode switch is connected to the reference potential through a second series circuit of two further oppositely polarized PIN diodes, with the junction between the two further PIN diodes also being charged with a control current. A resistor can be inserted between the last of the two further PIN diodes and the reference potential. A reflection-free termination is thus achieved.

DESCRIPTION OF THE PREFERRED EMBODIMENTS

Figure 1:
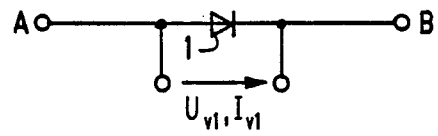
FIG. 1 is a circuit diagram of a prior art PIN diode switch.
Figure 2:
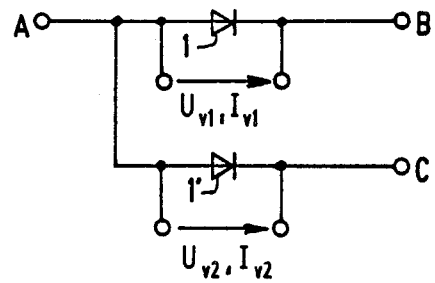
FIG. 2 is circuit diagram of a further embodiment of a prior art PIN diode switch.
Figure 3:
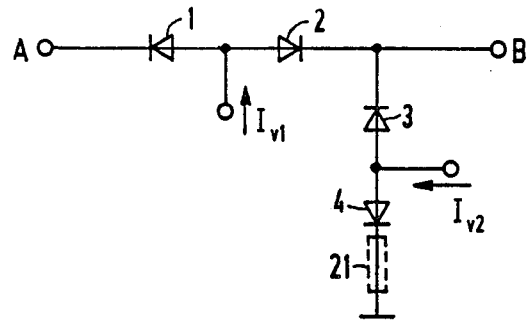
FIGS. 3 and 4 are circuit diagrams of two embodiments of PIN diode switches for use in explaining the subject matter of the application.

The principles on which the present invention is based shall be described in greater detail with reference to FIGS. 3 and 4. As shown in FIG. 3, a first series circuit of two oppositely polarized PIN diodes is disposed between an input A and an output B. The output B is connected to reference potential through a second series circuit consisting of PIN diodes 3 and 4, which are also oppositely polarized. Respective control currents $I_{v1}$ and $I_{v2}$ are supplied to the junction of the PIN diodes 1 and 2 and to the junction of the PIN diodes 3 and 4. When the PIN diode switch of FIG. 3 is to be closed, i.e., a connection between the input A and the output B is to be produced, a control current $I_{v1}$ is supplied to the junction between the PIN diode 1 and the PIN diode 2, the control current $I_{v1}$ being polarized in the conducting direction for both PIN diodes 1 and 2. Both PIN diodes 1 and 2 thus become conductive for a signal supplied at the input A, so that a conductive connection is present between the input A and the output B. At this time, the second series circuit consisting of the PIN diodes 3 and 4 is not charged with a control current, and thus is high-resistant, since one of the PIN diodes 3 and 4 is always in a non-conducting state.

If the PIN diode switch shown in FIG. 3 is to inhibit, only the second series circuit is charged with a control current $I_{v2}$, the current $I_{v2}$ being in the conducting direction for both PIN diodes 3 and 4. The first series circuit thus inhibits, because one of the PIN diodes 1 or 2 is always in a non-conducting state. The off-state resistance which results can, however, assume only limited values. Slight currents which are unavoidably transmitted via the PIN diodes 1 and 2, however, are shorted by the second, conductive series circuit. Radio-frequency signals are thus reflected. If a reflection is undesired, a connection to a reference potential can be made via a resistor 21 (shown in dashed lines) which absorbs the transmitted radio-frequency power.

Figure 4:
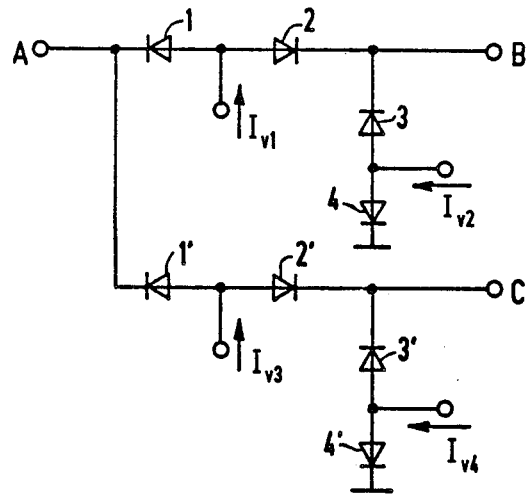

As shown in FIG. 4, the above-described arrangement can be used as a switchover circuit by using two identical PIN diode switches connected to the input A. The elements of the second PIN diode switch which are identical with the elements of the above-described PIN diode switch are supplied with the same reference symbols with a prime. The second PIN diode switch is connected to an output C.

In FIG. 4, when a signal at the input A is to be transmitted to the output B, the series circuit of PIN diodes 1 and 2 in the first PIN diode switch is charged with a control current $I_{v1}$, and the series circuit of the PIN diodes 3' and 4' in the second PIN diode switch is charged with a control current $I_{v4}$. A connection between the input A and the output B is thus present, with the path to the output C being inhibited.

If the signal at the input A of FIG. 4 is to be connected to the output C, the PIN diodes 3 and 4 in the first PIN diode switch are charged with a control current $I_{v2}$, and the PIN diodes 1' and 2' in the second PIN diode switch are charged with a control current $I_{v3}$, with the remaining diodes not being driven. A conductive connection thus exists between the input A and the output C, whereas the path to the output B is interrupted.

Figure 5:
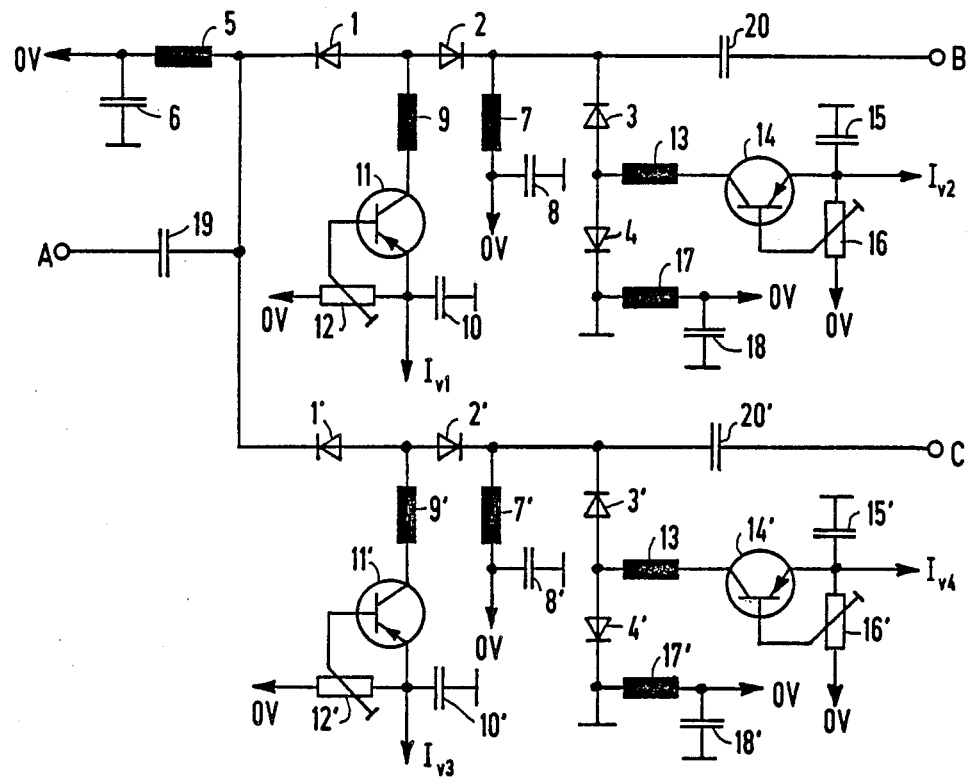
FIG. 5 is a circuit diagram of a PIN diode switch constructed in accordance with the principles of the present invention.

A circuit employing a PIN diode switch constructed in accordance with the principles of the present invention is shown in FIG. 5 which achieves separation between the direct current drive circuits and the radio-frequency circuit. In FIG. 5, the first series circuit, consisting of the PIN diodes 1 and 2, is connected via a capacitor 19 to the input A, and is connected to the output B via a capacitor 20. The control current $I_{v1}$ for the first series circuit is supplied to the junction of the PIN diodes 1 and 2 via the collector-emitter path of a transistor 11 and via an inductor 9. The base bias of the transistor 11 is adjustable by a potentiometer 12 having opposite terminals respectively connected to the emitter of the transistor 11 and to a zero potential, and having a tap connected to the base of the transistor 11. The emitter of the transistor 11 is also connected to the reference potential via a capacitor 10. The control current supplied via the transistor 11 and the inductor 9 flows, first, via the diode 1 and an inductor 5 to the zero potential, and, second, via the PIN diode 2 and an inductor 7, also to the zero potential. The terminals of the inductors 5 and 7 which face away from the respective PIN diodes 1 and 2 are each connected to ground, in the radio-frequency sense, via respective capacitors 6 and 8.

The control current $I_{v2}$ for the second series circuit is similarly applied to the junction between the PIN diodes 3 and 4 via the collector-emitter path of a transistor 14 and via an inductor 13. The base bias of the transistor 14 is again taken at the tap of a potentiometer 16 which is connected to the emitter of the transistor 14 and to zero potential. The emitter of the transistor 14 is connected to ground via a capacitor 15. The control current supplied to the junction of the PIN diodes 3 and 4 flows, first, via the PIN diode 3 and the inductor 7 to zero potential, and second, via the PIN diode 4 to zero potential. The terminal of the inductor 7 facing away from the PIN diode 4 is connected to ground through a capacitor 18.

The transistors 11 and 14 are inhibited as long as they are not charged with a control current, and thus decouple the drive circuit from the PIN diode switch. When charged with control currents $I_{v1}$ and $I_{v2}$, the transistors 11 and 14 become conductive.

The circuit of FIG. 5 also has a second circuit branch by which the input A is connectable to a second output C. This permits the circuit to be used as a switchover circuit. The second circuit branch is identical to the first branch described above, and identical components are provided with the same reference symbols identified with a prime. The inductor 5 and the capacitor 6 are used in common by both circuit branches for dissipating the current supplied to the diodes 1 and 1'.

As can be seen in FIG. 5, the direct current control circuits for the first series connection are separated from the circuit carrying the radio-frequency signals by the inductors 5, 7 and 9. The direct current control circuits for the second series circuit are separated from the radio-frequency carrying circuit by the inductors 7, 13 and 17. To prevent the radio-frequency signals from being coupled out of the circuit of FIG. 5, all outgoing lines are shorted to ground in the radio-frequency sense via capacitors 6, 8, 10, 15 and 18. The capacitors 19 and 20 prevent the control current supplied to the PIN diodes 1 through 4 from being transmitted to the input A or to the output B.

Radio-frequency voltages having a high amplitude can also be driven with the PIN diode switch shown in FIG. 5 without a high voltage being necessary for the drive circuit. The permissible amplitude of the radio-frequency voltage to be switched is limited only by the inhibiting voltage of the PIN diodes 1 through 4. Only one control circuit is required for driving the arrangement, and the control current is capable of being easily generated with high switching frequencies and high rise rates (low rise times), in contrast to conventional circuits requiring high reverse biases.

Although modifications and changes may be suggested by those skilled in the art it is the intention of the inventor to embody within the patent warranted hereon all changes and modifications as reasonably and properly come within the scope of his contribution to the art.

I claim as my invention:

1. A PIN diode switch for switching radio-frequency voltages between an input and an output of the switch, said PIN diode switch being used with a reference potential and comprising:

a series circuit consisting of first and second oppositely polarized PIN diodes, said diodes being connected at a junction and being disposed between said input and said output of said switch;

means for supplying a control current to said first and second PIN diodes at said junction including an inductor and a transistor, said control current being supplied to said junction via a series path including the collector-emitter path of said transistor and said inductor;

third and fourth PIN diodes connected in series between said output and said reference potential, said third and fourth PIN diodes being connected at a junction; and means for supplying a control current to said junction of said third and fourth PIN diodes.

2. A PIN diode switch as claimed in claim 1, wherein each of said first and second PIN diodes has a path associated therewith through which said control current flows following said first and second PIN diodes, each path having an inductor and a capacitor connected in series, and wherein said transistor has a control terminal and further comprising means for supplying a control signal to said control terminal of said transistor.

3. A PIN diode switch as claimed in claim 2, wherein said third PIN diode has a path associated therewith through which said control current flows after said third PIN diode, said path for said third PIN diode including the path associated with said second PIN diode.

* * * * *